United States Patent
Baliga et al.

(10) Patent No.: US 9,343,126 B2
(45) Date of Patent: May 17, 2016

(54) FREQUENCY SELECTION GRANULARITY FOR INTEGRATED CIRCUITS

(71) Applicant: Intel Corporation, Santa Clara, CA (US)

(72) Inventors: Harikrishna B. Baliga, Folsom, CA (US); Peter J. Smith, Folsom, CA (US); Joydeep Ray, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 472 days.

(21) Appl. No.: 13/730,607

(22) Filed: Dec. 28, 2012

(65) Prior Publication Data

US 2014/0071784 A1  Mar. 13, 2014

Related U.S. Application Data

(60) Provisional application No. 61/699,982, filed on Sep. 12, 2012.

(51) Int. Cl.
*G06F 1/04* (2006.01)
*G11C 8/18* (2006.01)
*H03L 7/18* (2006.01)
*H03L 7/07* (2006.01)

(52) U.S. Cl.
CPC .. *G11C 8/18* (2013.01); *H03L 7/07* (2013.01); *H03L 7/18* (2013.01)

(58) Field of Classification Search
CPC ............... G11C 8/18; H03L 7/07; H03L 7/18
USPC .................................................. 713/500, 501
See application file for complete search history.

(56) References Cited

U.S. PATENT DOCUMENTS

| | | | | |
|---|---|---|---|---|
| 5,142,247 A * | 8/1992 | Lada, Jr. | ................... | H03L 7/18 331/14 |
| 6,654,898 B1 * | 11/2003 | Bailey et al. | ................... | 713/500 |
| 6,654,899 B2 * | 11/2003 | Fayneh | ................... | H03L 7/23 710/61 |
| 6,885,227 B2 * | 4/2005 | Agrawal | ................... | H03L 7/0891 327/156 |
| 7,289,000 B2 * | 10/2007 | Hanna | ................... | 331/74 |
| 7,511,582 B2 * | 3/2009 | Yin | ................... | 331/36 C |
| 7,804,435 B2 * | 9/2010 | Sadowski | ................... | H04N 19/176 341/155 |
| 7,902,886 B2 * | 3/2011 | Pfaff et al. | ................... | 327/147 |
| 8,078,901 B1 * | 12/2011 | Meyer et al. | ................... | 713/501 |
| 8,242,849 B1 * | 8/2012 | Seethamraju | ................... | H03L 7/1976 331/17 |
| 8,278,980 B1 * | 10/2012 | Dubost et al. | ................... | 327/147 |
| 8,832,324 B1 * | 9/2014 | Hodges et al. | ................... | 710/5 |
| 8,842,490 B2 * | 9/2014 | Quach et al. | ................... | 365/230.02 |
| 8,928,505 B1 * | 1/2015 | Coenen et al. | ................... | 341/110 |
| 2005/0259505 A1 * | 11/2005 | Grand | ................... | G01R 31/31727 365/189.02 |
| 2008/0238504 A1 * | 10/2008 | Kwon | ................... | 327/156 |
| 2010/0156459 A1 * | 6/2010 | Plants et al. | ................... | 326/39 |
| 2011/0063000 A1 * | 3/2011 | Sunkavalli et al. | ................... | 327/156 |
| 2013/0111256 A1 * | 5/2013 | Kim | ................... | G06F 13/1689 713/501 |

\* cited by examiner

*Primary Examiner* — Mark Connolly
(74) *Attorney, Agent, or Firm* — Blakely, Sokoloff, Taylor & Zafman LLP

(57) ABSTRACT

Clock signal generation circuitry. A frequency multiplier is coupled to receive a clock signal and to generate a frequency-multiplied clock signal. A switching circuit is coupled to receive at least two reference clock signals. The switching circuit provides one of the reference clock signals in response to a reference select signal. A phase locked loop (PLL) is coupled to receive the frequency-multiplied clock signal and the selected reference clock signal. The PLL generates an output clock signal.

15 Claims, 3 Drawing Sheets

FREQUENCY SELECTION GRANULARITY FOR INTEGRATED CIRCUITS

This application claims the benefit of US provisional patent application No. 61/699,982 filed Sep. 12, 2012.

TECHNICAL FIELD

Embodiments of the invention relate to clock signaling for integrated circuits. More particularly, embodiments of the invention relate to techniques and architectures to provide improved frequency granularity for use with integrated circuits.

BACKGROUND

A digital integrated chip typically generates an internal clock used to control latches and flip-flops generated by driving a phase locked loop (PLL) with an external reference clock signal. The internal clock signal can then be adjusted in integer multiples of the reference clock signal by changing the PLL ratio. The PLL output frequency for each unique ratio for a given reference clock signal can be referred to as a "clock bin" where the number of clock bins is physically limited to the lock range of the PLL. The PLL output frequency can also be adjusted linearly by varying the external reference clock signal; however, this is generally used to reach frequencies between clock bins because the reference frequency is limited to the lock range of the PLL. The lock range of certain low-noise PLLs are extremely limited so this method has limited usage.

Designs with multiple clock and/or power domains typically employ a separate PLL for each domain fed by a single master reference clock signal. This creates dependencies that limit fine-tuning between clock bins for each domain, but a single master reference clock signal reduces cost and simplifies inter-domain signal transfer. Transferring signals between clock domains requires synchronization in order to insure determinism and avoid meta-stability. Alignment of clocks derived from the same reference can be used for synchronization, but transfer delay between domains can be slower than either domain because alignment first occurs at the least common multiple of the frequencies.

To generate clock bins that are not integer multiples of the external reference clock, the output of a phase locked loop (PLL) can be divided then used as the reference clock for another PLL. For example, an external reference clock of 100 MHz can generate a 400 MHz PLL output. This PLL output can then be divided by 3 to derive a 133 MHz reference to a secondary PLL, which provides 133 MHz clock bins such as 1866 MHz, with a PLL ratio of 14.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
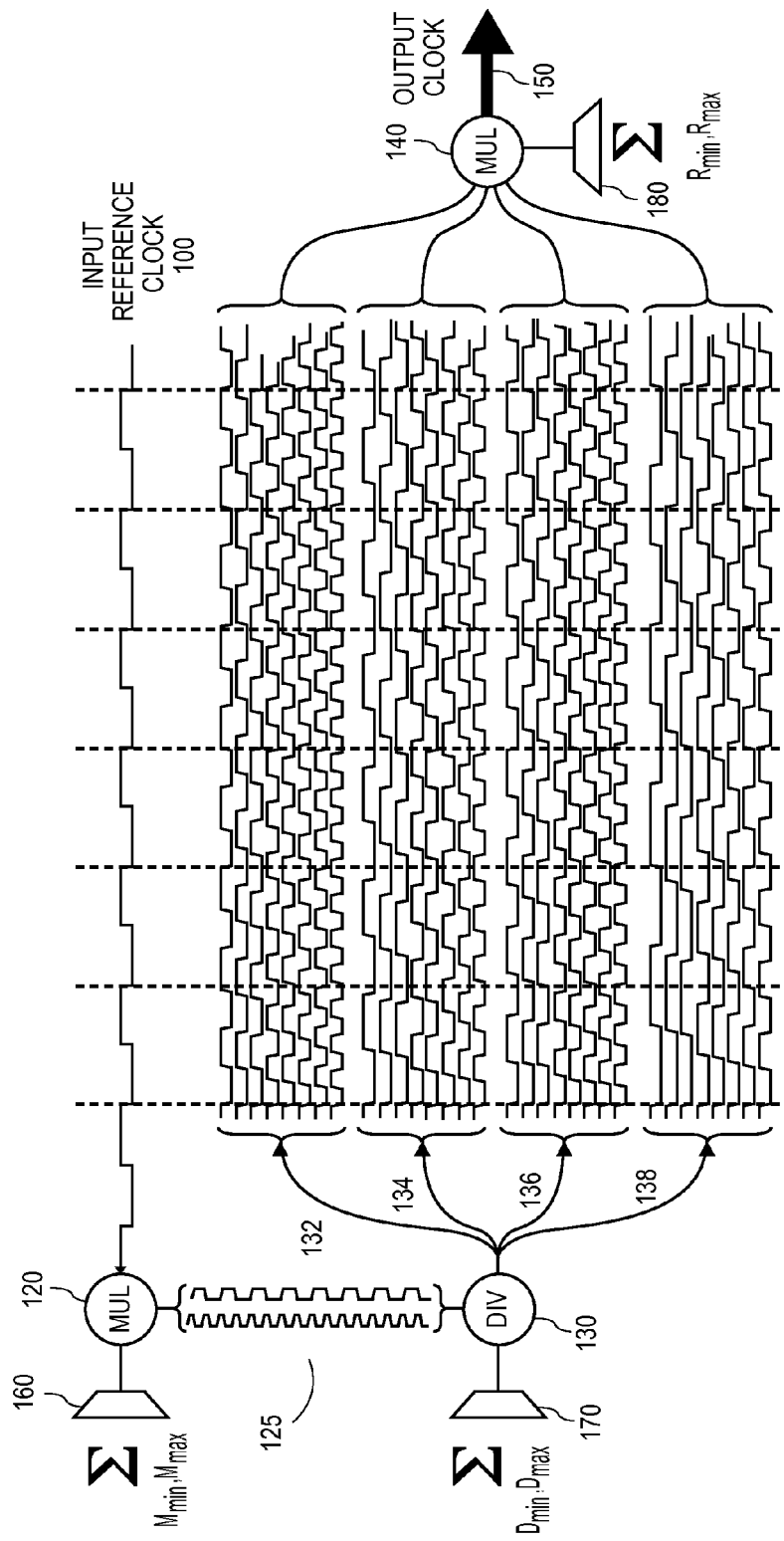
FIG. 1 is a timing diagram of corresponding to a technique for providing improved clock frequency granularity.

In the following description, numerous specific details are set forth. However, embodiments of the invention may be practiced without these specific details. In other instances, well-known circuits, structures and techniques have not been shown in detail in order not to obscure the understanding of this description.

Described herein are mechanisms to provide configurable fractional clock bins through the selection of multiple derived reference clock signals. In one embodiment, an external reference clock signal (C) is fed into a PLL through a multiplier (M) then divided by an integer (N) as a reference clock to a secondary PLL to provide fractional clock bins separated by C*M/N. An alternative configuration with a multiplier (P) and divider (Q) can provide fractional clock bins separated by C*P/Q.

Each of these clock configurations will align at certain clock bins based on their least common multiple, but each will also reach intermediate frequencies unachievable by the other. The combination of C*M/N and C*P/Q provides irregular clock bins of improved granularity. By allowing many non-uniform clock bins through full configurability of the fraction M/N, these mechanisms can provide sufficient granularity to provide a full frequency spectrum with only minor adjustments to C. This configurability also improves system optimizations such as higher base clock ratios for power and improved synchronization at crossovers.

In one embodiment, the mechanisms described herein can be used to provide additional gear ratios for double data rate (DDR) memory over clocking by using a different clock reference for the PLL. Finer granularity provides platform performance benefits along with cost savings. In addition this restores partial control for over-clockers that was available in prior products that had a front-side bus (FSB).

For DDR implementations, normal gear ratios are 266 MHz increments based on a 133 MHz reference clock signal. Thus, six frequencies were supported: 800 MHz, 1066 MHz, 1333 MHz, 1600 MHz, 1866 MHZ, and 2133 MHz. In one embodiment, additional gear ratios are added that are 200 MHz increments based on a 100 MHz reference clock signal. Thus, eight new frequencies can be provided: 1200 MHz, 1400 MHz, 1800 MHz, 2000 MHz, 2200 MHz, 2400 MHz, 2600 MHz, and 2800 MHz.

DDR overclocking allows end users to increase the frequency and (optionally) voltage of memory devices (e.g., dynamic random access memory, or DRAM) and memory controller beyond the DRAM specification. The following are the important aspects that determine the "over-clockability" of a system. Granularity, which is a measure of how fine-grain the target frequency can be adjusted. Range, which indicates the maximum frequency logically possible. Isolation, which is a measure of whether the different clocks can be adjusted independent of each other.

Overclocking is typically viewed as an important feature for high-end desktop systems. However, with the high growth in notebook shipment in recent years, overclocking is now considered an important feature for mobile platforms also. Another important segment with overclocking requirement is the mainstream desktop. Mainstream desktop platforms are typically populated with "locked" processors (i.e., processors with frequency multiplier locked). For this segment, overclocking was achieved by changing the system reference clock. However, due to integrating chipset logic in the processor and use of fixed ratio PLLs for clock signals, overclocking by changing the system reference clock is limited.

FIG. 1 is a timing diagram of corresponding to a technique for providing improved clock frequency granularity. The example of FIG. 1 provides specific numbers of clock signals, multipliers, dividers, etc. However, any number of these elements can be supported.

Input reference clock signal 100 is any type or frequency reference clock signal that will be used to drive circuitry (e.g., memory, processors, controllers). In the example above the reference clock signal is 100 MHz; however, any frequency may be utilized with the techniques described herein.

Frequency multiplier 120 multiples reference clock signal 100 to provide one or more intermediate clock signals 125. The intermediate clock signal(s) is/are provided to frequency divider 130, which provides one or more sets of clock groups (e.g., 132, 134, 136, 138). A selected clock signal is provided to frequency multiplier 140 to generate output clock signal 150.

In one embodiment, one or more of frequency multiplier 120, frequency divider 130 and frequency multiplier 140 can be coupled with multiplexor (e.g., 160, 170, 180) that can be used to select a reference clock to provide improved clock bin granularity. One embodiment for selectable reference clock signals is provided in FIG. 2.

Figure 2:
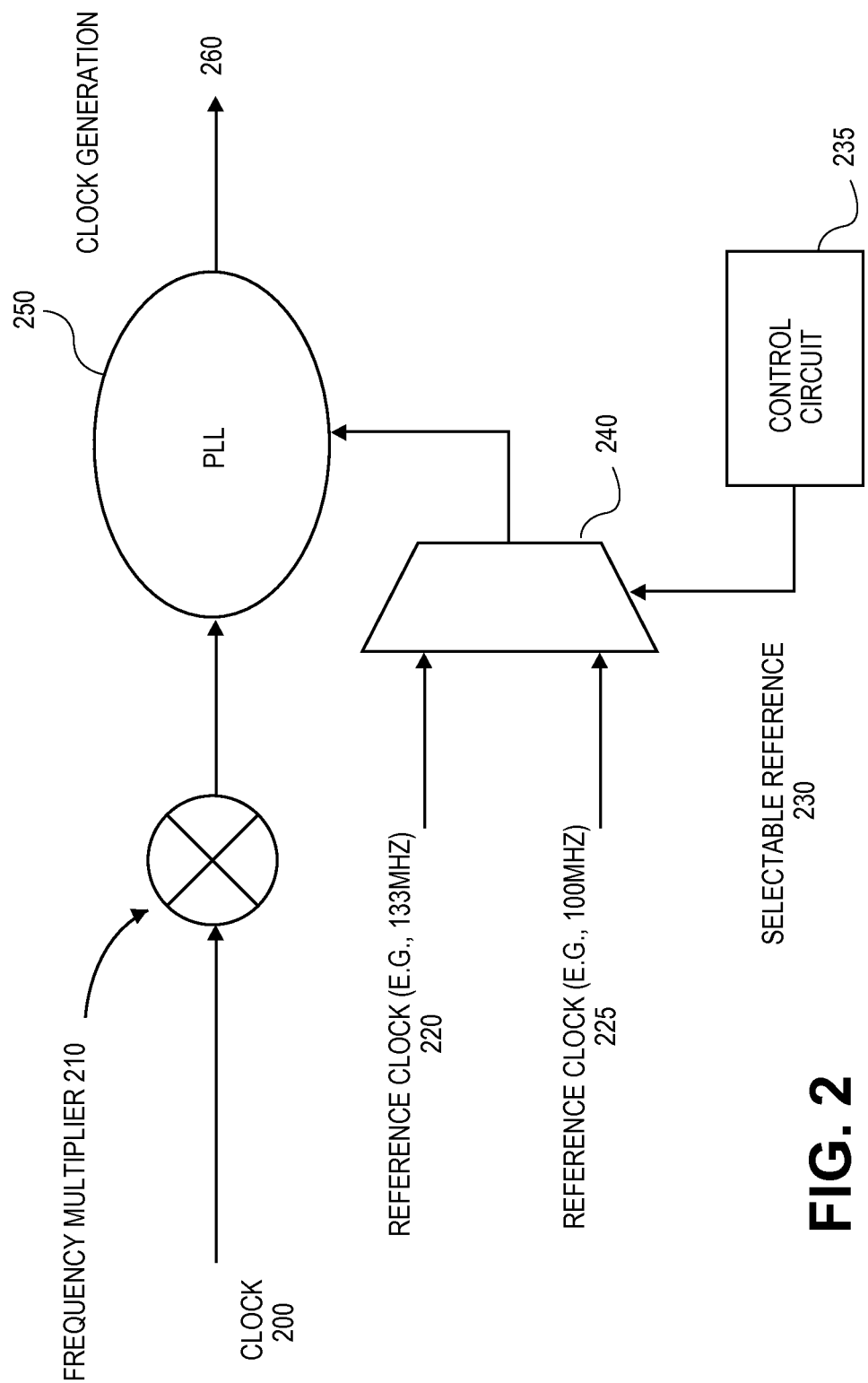
FIG. 2 is a circuit level diagram of circuitry to provide improved clock frequency granularity.

FIG. 2 is a block level diagram of circuitry to provide improved clock frequency granularity. The circuit of FIG. 2 functions to provide a selectable reference clock signal and can be utilized as described herein to provide clock bins with improved granularity. In some embodiments, the circuit of FIG. 2 can be utilized to operate with a lower reference clock signal during a lower power state to support lower power consumption.

Clock signal 200 is multiplied by frequency multiplier 210 to provide an input signal to PLL 250. In one embodiment, the reference clock signal to be used by PLL 250 is provided by multiplexor 240. The example of FIG. 2 includes two selectable reference clock signals, 220 and 225; however, any number of selectable reference clock signals can be supported.

Selection of the reference clock signals by multiplexor 240 is in response to reference select signal 230, which is provided by control circuit 235. By providing varying reference clock signals to PLL 250, output clock signal 260 can be more finely controlled than would otherwise be possible. Control circuit 235 can provide reference select signal 230 based on various factors. For example, in an overclocking application, control circuit 235 may provide a lower reference clock signal with increased frequency multiplication to achieve the desired output frequency. As another example, in a lower power state example, control circuit 235 may provide a lower reference clock signal with increased frequency multiplication to achieve the same output frequency with reduced power consumption within the host system.

In one embodiment, control circuit 235 controls the reference clock signal based on control register (CR) bit (or bits). A system BIOS (e.g., ROM 330 in FIG. 3) may also be utilized to control various system components (e.g., processor, bus) in response to another component (e.g., memory) operating at a different (e.g., higher) frequency. Control circuit 235 and/or the BIOS may also function to control one or more multipliers to achieve the desired output frequencies.

For example, when extending a DDR operating frequency beyond a specified operating frequency, various other changes are also utilized to support this overclocking environment.

Figure 3:
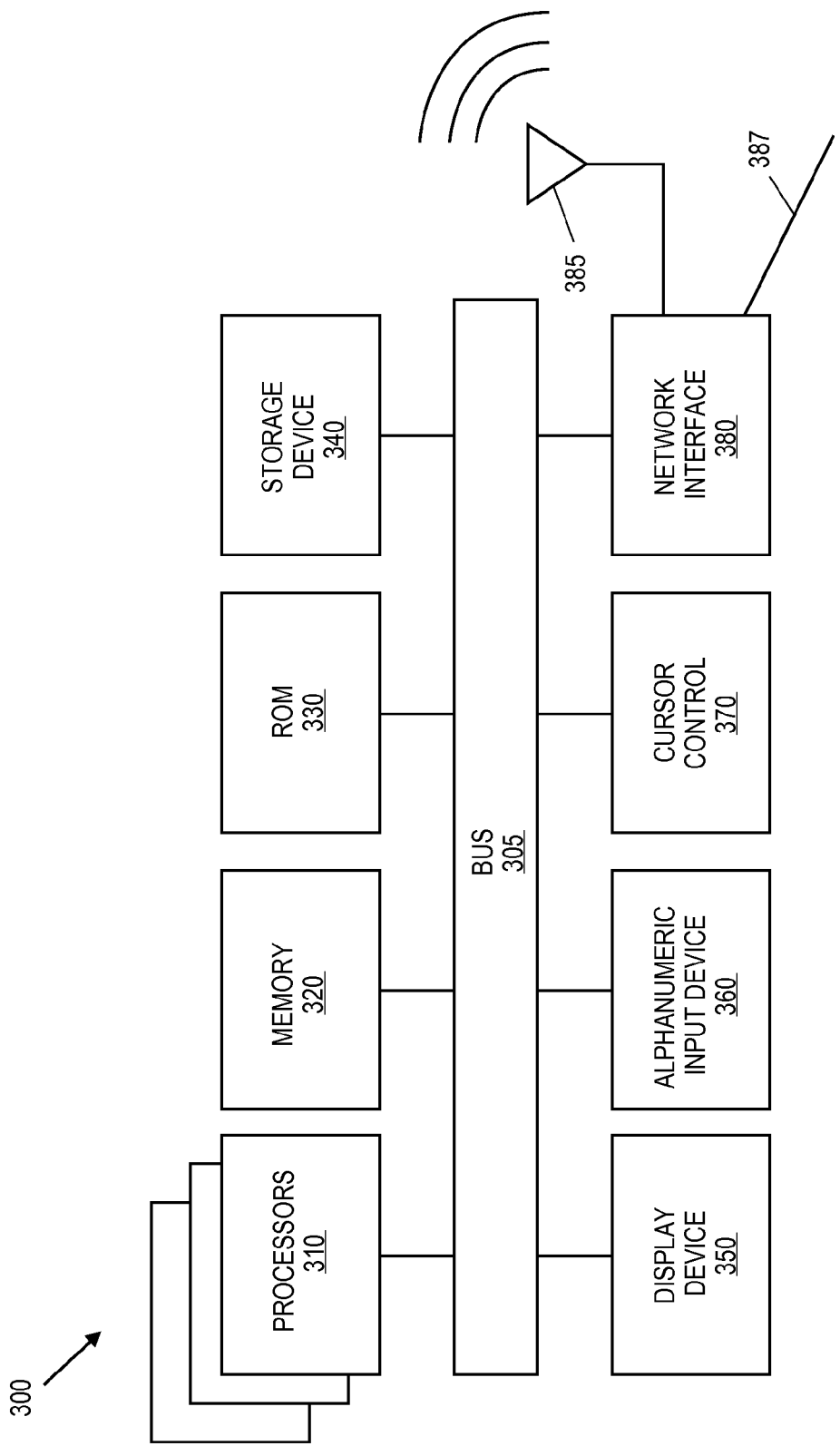
FIG. 3 is a block diagram of one embodiment of an electronic system.

FIG. 3 is a block diagram of one embodiment of an electronic system. The electronic system illustrated in FIG. 3 is intended to represent a range of electronic systems (either wired or wireless) including, for example, desktop computer systems, laptop computer systems, cellular telephones, personal digital assistants (PDAs) including cellular-enabled PDAs, set top boxes, tablets, etc. Alternative electronic systems may include more, fewer and/or different components.

One or more components of electronic system 300 may utilize clock signals generated in the manner described herein. For example, in one embodiment, the circuitry of FIG. 2 may be included in memory 320 to allow for overclocking of DDR memory. As another example, the circuitry of FIG. 2 may be utilized to overclock one or more of processor(s) 310.

Electronic system 300 includes bus 305 or other communication device to communicate information, and processor 310 coupled to bus 305 that may process information. While electronic system 300 is illustrated with a single processor, electronic system 300 may include multiple processors and/or co-processors. Electronic system 300 further may include random access memory (RAM) or other dynamic storage device 320 (referred to as main memory), coupled to bus 305 and may store information and instructions that may be executed by processor 310. Main memory 320 may also be used to store temporary variables or other intermediate information during execution of instructions by processor 310.

Electronic system 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled to electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate direction information and command selections to processor 310 and to control cursor movement on display 350.

Electronic system 300 further may include network interface(s) 380 to provide access to a network, such as a local area network. Network interface(s) 380 may include, for example, a wireless network interface having antenna 385, which may represent one or more antenna(e). Network interface(s) 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface(s) 380 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In one embodiment, a frequency multiplier is coupled to receive a clock signal and to generate a frequency-multiplied clock signal. A switching circuit is coupled to receive at least two reference clock signals. The switching circuit provides a selected one of the at least two reference clock signals in response to a reference select signal. A phase locked loop (PLL) is coupled to receive the frequency-multiplied clock signal and the selected reference clock signal. The PLL generates an output clock signal.

In one embodiment, one or more frequency dividers are coupled in series with the frequency multiplier. In one embodiment, a plurality of frequency multipliers coupled with the one or more frequency dividers. The frequency multipliers and the frequency dividers are coupled in combination. In one embodiment, the frequency dividers and the frequency multipliers are selected in response to a value stored in a control register. In one embodiment, the reference clock signal is selected in response to a value stored in a control register.

In one embodiment, at least one memory device is coupled to receive the output clock signal. In one embodiment, the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected. In one embodiment, the memory device conforms to a double data rate (DDR) standard.

In one embodiment, a frequency multiplier is coupled to receive a clock signal and to generate a frequency-multiplied clock signal. A switching circuit is coupled to receive at least two reference clock signals. The switching circuit provides a selected one of the at least two reference clock signals in response to a reference select signal. A phase locked loop (PLL) is coupled to receive the frequency-multiplied clock signal and the selected reference clock signal. The PLL generates an output clock signal. At least one memory device is coupled to the PLL to operate using the output clock signal.

In one embodiment, one or more frequency dividers are coupled in series with the frequency multiplier. In one embodiment, a plurality of frequency multipliers coupled with the one or more frequency dividers. The frequency multipliers and the frequency dividers are coupled in combination. In one embodiment, the frequency dividers and the frequency multipliers are selected in response to a value stored in a control register. In one embodiment, the reference clock signal is selected in response to a value stored in a control register.

In one embodiment, at least one memory device is coupled to receive the output clock signal. In one embodiment, the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected. In one embodiment, the memory device conforms to a double data rate (DDR) standard.

In one embodiment, a clock signal is received with a frequency multiplier. A frequency-multiplied clock signal is generated with the frequency multiplier. At least two reference clock signals are received with a switching circuit. A selected one of the at least two reference clock signals is provided in response to a reference select signal with the switching circuit. An output clock signal is generated with a phase locked loop (PLL) coupled to receive the frequency-multiplied clock signal and the selected reference clock signal.

In one embodiment, the output clock signal is provided to at least one memory device. In one embodiment, the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected. In one embodiment, the memory device conforms to a double data rate (DDR) standard. In one embodiment, the reference clock signal is selected in response to a value stored in a control register.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   memory device clocking circuitry, comprising:
   a frequency multiplier coupled to receive a clock signal and to generate a frequency-multiplied clock signal;
   a switching circuit coupled to receive at least two reference clock signals each having a different frequency, the switching circuit to provide a selected one of the at least two reference clock signals in response to a reference select signal;
   a phase locked loop (PLL) coupled to receive the frequency-multiplied clock signal and the selected reference clock signal, the PLL to generate an output clock signal based on the frequency-multiplied clock signal and the selected reference clock signal wherein the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected.

2. The apparatus of claim 1 further comprising one or more frequency dividers coupled in series with the frequency multiplier.

3. The apparatus of claim 2 further comprising a plurality of frequency multipliers coupled with the one or more frequency dividers, wherein the frequency multipliers and the frequency dividers are coupled in combination.

4. The apparatus of claim 3 wherein the frequency dividers and the frequency multipliers are selected in response to a value stored in a control register.

5. The apparatus of claim 1 wherein the reference clock signal is selected in response to a value stored in a control register.

6. A system comprising:
a memory device coupled to memory device clocking circuitry, the memory device clocking circuitry, comprising:
a frequency multiplier coupled to receive a clock signal and to generate a frequency-multiplied clock signal;
a switching circuit coupled to receive at least two reference clock signals each having a different frequency, the switching circuit to provide a selection of one of the at least two reference clock signals in response to a reference select signal;
a phase locked loop (PLL) coupled to receive the frequency-multiplied clock signal and the selected reference clock signal, the PLL to generate an output clock signal based on the frequency-multiplied clock signal and the selected reference clock signal wherein the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected.

7. The system of claim 6 further comprising one or more frequency dividers coupled in series with the frequency multiplier.

8. The system of claim 7 further comprising a plurality of frequency multipliers coupled with the one or more frequency dividers, wherein the frequency multipliers and the frequency dividers are coupled in combination.

9. The system of claim 8 wherein the frequency dividers and the frequency multipliers are selected in response to a value stored in a control register.

10. The system of claim 6 wherein the memory device conforms to a double data rate (DDR) standard.

11. The system of claim 6 wherein the reference clock signal is selected in response to a value stored in a control register.

12. A method comprising:
generating a clock signal for a memory device by performing the following:
receiving a clock signal with a frequency multiplier;
generating a frequency-multiplied clock signal with the frequency multiplier;
receiving at least two reference clock signals with a switching circuit each having a different frequency;
providing a selected one of the at least two reference clock signals in response to a reference select signal with the switching circuit;
generating an output clock signal with a phase locked loop (PLL) coupled to receive the frequency-multiplied clock signal and the selected reference clock signal based on the frequency-multiplied clock signal and the selected reference clock signal wherein the output clock signal has a frequency specified in a double data rate (DDR) memory standard when a first reference clock signal is selected with the switching circuit and the output clock signal has a frequency greater than specified in the DDR memory standard or a frequency that is in between two frequencies specified in the DDR memory standard, when a second reference clock signal is selected.

13. The method of claim 12 further comprising providing the output clock signal to at least one memory device.

14. The method of claim 13 wherein the memory device conforms to a double data rate (DDR) standard.

15. The method of claim 13 wherein the reference clock signal is selected in response to a value stored in a control register.

* * * * *